US009943001B2

(12) United States Patent
Takahashi et al.

(10) Patent No.: US 9,943,001 B2
(45) Date of Patent: Apr. 10, 2018

(54) SWITCH BOX

(71) Applicant: Yazaki Corporation, Minato-ku, Tokyo (JP)

(72) Inventors: Hideo Takahashi, Makinohara (JP);
Koji Ikegaya, Makinohara (JP);
Takuya Nakagawa, Makinohara (JP);
Masahide Tsuru, Makinohara (JP)

(73) Assignee: Yazaki Corporation, Minato-ku, Tokyo (JP)

( * ) Notice: Subject to any disclaimer, the term of this patent is extended or adjusted under 35 U.S.C. 154(b) by 0 days.

(21) Appl. No.: 15/389,487

(22) Filed: Dec. 23, 2016

(65) Prior Publication Data

US 2017/0105306 A1   Apr. 13, 2017

Related U.S. Application Data

(63) Continuation of application No. PCT/JP2015/067803, filed on Jun. 19, 2015.

(30) Foreign Application Priority Data

Jun. 25, 2014   (JP) ................. 2014-130497

(51) Int. Cl.
    *H05K 7/00*   (2006.01)
    *H05K 7/14*   (2006.01)
    *H05K 5/00*   (2006.01)
(52) U.S. Cl.
    CPC ......... *H05K 7/1432* (2013.01); *H05K 5/0026* (2013.01)

(58) Field of Classification Search
    CPC .................... H05K 5/0026; H05K 7/1432
    See application file for complete search history.

(56) References Cited

U.S. PATENT DOCUMENTS

| | | | | |
|---|---|---|---|---|
| 5,118,903 A | * | 6/1992 | Schupp | H05K 7/20854 174/16.3 |
| 5,762,525 A | * | 6/1998 | Candeloro | H01R 25/162 439/208 |
| 6,552,914 B1 | * | 4/2003 | Chang | H05K 7/142 361/740 |

(Continued)

FOREIGN PATENT DOCUMENTS

| | | |
|---|---|---|
| JP | 2001-028832 A | 1/2001 |
| JP | 2001-258126 A | 9/2001 |

(Continued)

OTHER PUBLICATIONS

Sep. 8, 2015—International Search Report—Intl App PCT/JP2015/067803.

(Continued)

*Primary Examiner* — Yuriy Semenenko
(74) *Attorney, Agent, or Firm* — Banner & Witcoff, Ltd.

(57) ABSTRACT

Provided is a switch box comprising: a first circuit board; a pair of bus bars provided to the first circuit board; and a first switch portion that is provided to the first circuit board and that opens and closes a circuit between the bus bars. A second circuit board can be attached to and detached from the first circuit board, and the second circuit board comprises: one bus bar; and a second switch portion that opens and closes a circuit between the one bus bar and the bus bar of the first circuit board.

4 Claims, 13 Drawing Sheets

(56) References Cited

U.S. PATENT DOCUMENTS

| | | | | |
|---|---|---|---|---|
| 6,982,876 B1* | 1/2006 | Young | ............... | H05K 1/0203 |
| | | | | 165/185 |
| 7,333,337 B2* | 2/2008 | Kita | ............... | B60R 16/0239 |
| | | | | 165/104.33 |
| 8,068,348 B2* | 11/2011 | Chritz | ............... | H05K 1/0263 |
| | | | | 174/255 |
| 8,254,126 B2* | 8/2012 | Uejima | ............... | H01L 23/36 |
| | | | | 165/185 |
| 9,756,729 B2* | 9/2017 | Kontani | ............... | H05K 1/181 |
| 2005/0133357 A1* | 6/2005 | Shimoda | ............... | B60Q 3/82 |
| | | | | 200/550 |
| 2009/0004888 A1* | 1/2009 | Soga | ............... | H05K 3/103 |
| | | | | 439/43 |
| 2017/0018920 A1* | 1/2017 | Tozawa | ............... | H02H 7/205 |

FOREIGN PATENT DOCUMENTS

| | | | |
|---|---|---|---|
| JP | 2001-268748 | A | 9/2001 |
| JP | 2005-218171 | A | 8/2005 |
| JP | 2006-286465 | A | 10/2006 |
| JP | 2007-145208 | A | 6/2007 |
| JP | 2013-038948 | A | 2/2013 |
| JP | 2013-198318 | A | 9/2013 |
| JP | 2014-034288 | A | 2/2014 |

OTHER PUBLICATIONS

Dec. 12, 2017—(JP) Notification of Reasons for Refusal—App 2014-130497.

* cited by examiner

SWITCH BOX

CROSS REFERENCE TO RELATED APPLICATIONS

This application is a continuation of PCT application No. PCT/JP2015/067803, which was filed on Jun. 19, 2015 based on Japanese patent application (patent application 2014-130497) filed on Jun. 25, 2014, whose contents are incorporated herein by reference. Also, all the references cited herein are incorporated as a whole.

BACKGROUND OF THE INVENTION

1. Technical Field

The present invention relates to a switch box to be provided in a power supply system of a vehicle.

2. Background Art

In a power supply system of a vehicle, switches are provided so that they can be controlled to be opened and closed by a control unit. The number of switches may be changed in accordance with a change in the configuration of the power supply system. One switch is provided in a power supply system disclosed in Patent Literature JP-A-2013-198318, while two switches are provided in a power supply system disclosed in Patent Literature JP-A-2014-34288.

SUMMARY

When the number of switches is thus changed in accordance with a change in the configuration of a power supply system, a switch box having the changed number of switches has to be manufactured newly. As a result, the man-hours of development and the manufacturing cost increase.

The present invention has been developed in consideration of the aforementioned situation. An object of the invention is to provide an economical switch box capable of suppressing increase in man-hours of development and increase in manufacturing cost caused by a change in number of switches.

In order to attain the aforementioned object, switch boxes according to the invention are characterized by the following configurations (1) to (4).

(1) A switch box comprising:
   a first circuit board:
   a pair of bus bars that are provided in the first circuit board; and
   a first switch portion that is provided in the first circuit board so as to open and close a circuit between the pair of bus bars; wherein:
   a second circuit board can be removably attached to the first circuit board, the second circuit board including:
   a bus bar; and
   a second switch portion that opens and closes a circuit between the bus bar of the second circuit board and one of the bus bars of the first circuit board.

(2) A switch box according to the aforementioned configuration (1), wherein:
   the one of the bus bars of the first circuit board has coupling terminals that can be connected to the second circuit board.

(3) A switch box according to the aforementioned configuration (1), wherein:
   the bus bar of the second circuit board is disposed in an intermediate position between the pair of bus bars of the first circuit board when the second circuit board is mounted on the first circuit board.

(4) A switch box according to the aforementioned configuration (1), wherein:
   the switch box is provided between a main battery and a sub-battery in a power supply system for a vehicle, the power supply system including the main battery and the sub-battery that supply electric power to various loads.

According to the switch box having the aforementioned configuration (1), when one switch function is required in a circuit, only the first circuit board having the first switch portion is provided, and the circuit is connected to the bus bars of the first circuit board. Thus, the circuit can be opened and closed by the first switch portion. On the other hand, when two switch functions are required in circuits, the second circuit board having the second switch portion is mounted on the first circuit board, and the circuits are connected to the bus bars. Thus, one of the circuits can be opened and closed by the first switch portion while the other circuit can be opened and closed by the second switch portion.

For example, even if the number of switches in a power supply system is changed in accordance with a change in the configuration of the system, it is not necessary to design and manufacture a switch box corresponding to the number of switches, but it is possible to provide a switch box capable of supporting each power supply system. Thus, parts, housings, etc. can be shared. It is possible to economically suppress increase in man-hours of development and increase in manufacturing cost due to a change in the number of switches.

In the switch box having the aforementioned configuration (2), when the coupling terminals of one of the bus bars of the first circuit board are connected to the second circuit board, the switch box can be extremely easily arranged to have the first switch portion of the first circuit board and the second switch portion of the second circuit board.

In the switch box having the aforementioned configuration (3), the bus bar of the second circuit board is disposed in an intermediate position between the pair of bus bars of the first circuit board. It is therefore possible to secure good heat radiation in each bus bar. Thus, even when the bus bars generate heat due to an electric current flowing therein, heat interference affecting electronic components etc. can be suppressed as well as possible.

In a power supply system for a vehicle including a main battery and a sub-battery, switches are provided for switching power supply from the main battery and the sub-battery to various loads. The number of switches may be changed in accordance with a change in specification or the like. Even in such a case, according to the switch box having the aforementioned configuration (4), the number of switches can be changed easily to support the change in the power supply system when the second circuit board is attached to or removed from the first circuit board.

According to the invention, it is possible to provide an economical switch box capable of suppressing increase in man-hours of development and increase in manufacturing cost caused by a change in number of switches.

The invention has been described briefly above. The further details of the invention will be made clearer if the following Mode for Carrying Out the Invention (hereinafter referred to as "embodiment") is read through with reference to the accompanying drawings.

BRIEF DESCRIPTION OF THE DRAWINGS

FIGS. 4A to 4C are views showing the bus bar.

FIGS. 10A to 10C are views showing the bus bar.

FIG. 13A and FIG. 13B are views showing a power supply system using the switch box according to the embodiment. FIG. 13A and FIG. 13B are schematic configuration views respectively.

DETAILED DESCRIPTION OF EMBODIMENTS

A specific embodiment of the invention will be described below with reference to the drawings.

Figure 1:
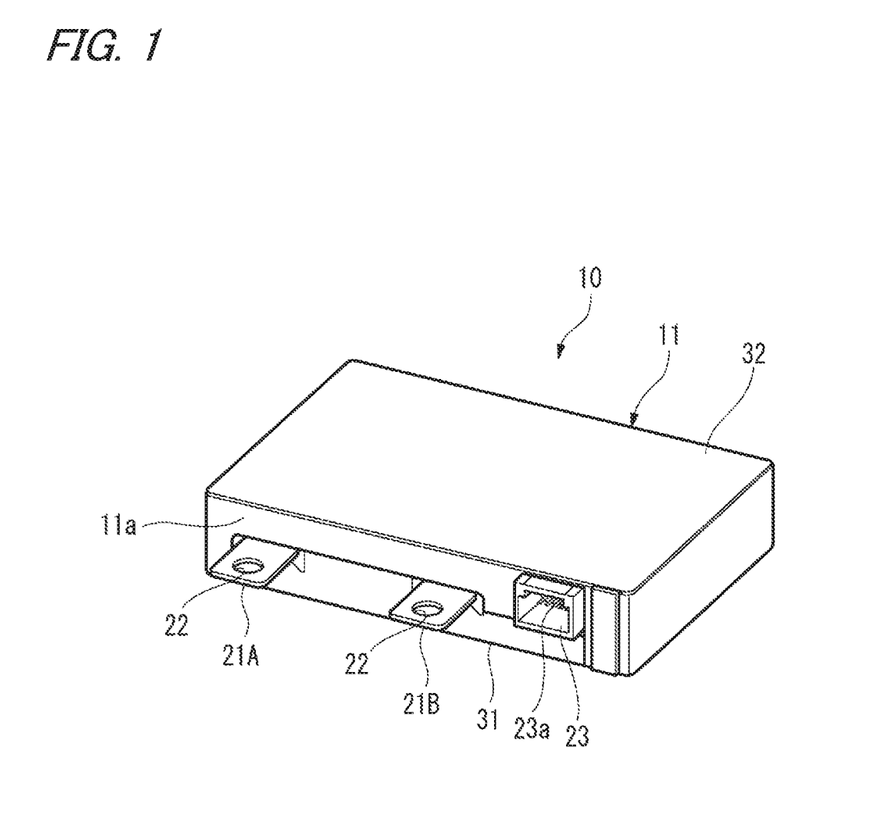
FIG. 1 is a perspective view of a switch box according to an embodiment of the invention.

FIG. 1 is a perspective view of a switch box according to the embodiment.

As shown in FIG. 1, a switch box 10 according to the embodiment has a housing 11 having a rectangular parallelepiped shape. In the switch box 10, two connection terminal portions 21A and 21B are exposed from a front face portion 11a of the housing 11. Mating terminal portions are fastened and connected to the connection terminals 21A and 21B by bolts. Bolt insertion holes 22 to which the bolts for fastening the mating terminal portions are inserted are formed in the connection terminal portions 21A and 21B respectively.

In addition, a connector 23 is provided in the front face portion 11B of the housing 11. A fitting concave portion 23a of the connector 23 is exposed from the front face portion 11B. A mating connector provided in a control line of a wire harness is fitted and connected to the connector 23.

The housing 11 is constituted by a lower case 31 and an upper case 32. The upper case 2 is removably attached to the lower case 1.

Figure 2:
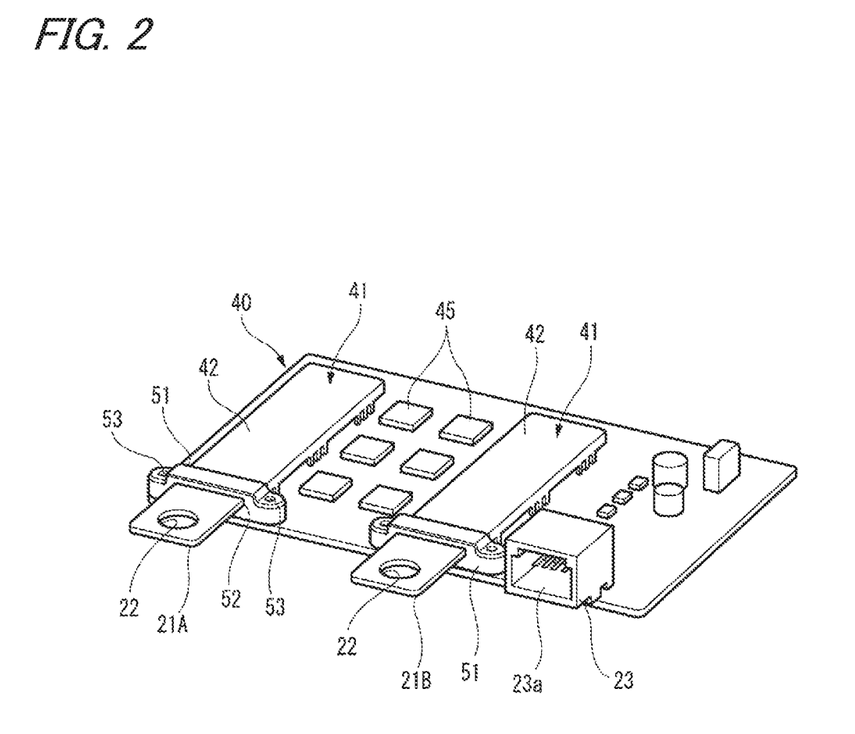
FIG. 2 is a perspective view of a first circuit board to be received in a housing.

FIG. 2 is a perspective view of a first circuit board to be received in the housing.

As shown in FIG. 2, a first circuit board 40 is received inside the housing 11 in the switch box 10. Two bus bars 41 are mounted on the first circuit board 40. End parts of the bus bars 41 serve as the connection terminal portions 21A and 21B having the bolt insertion holes 22 respectively. In addition, the connector 23 is mounted on the first circuit board 40. In addition, electronic components 45 are mounted on the first circuit board 40. The electronic components 45 include semiconductor devices, etc, for performing switching.

Figure 3:
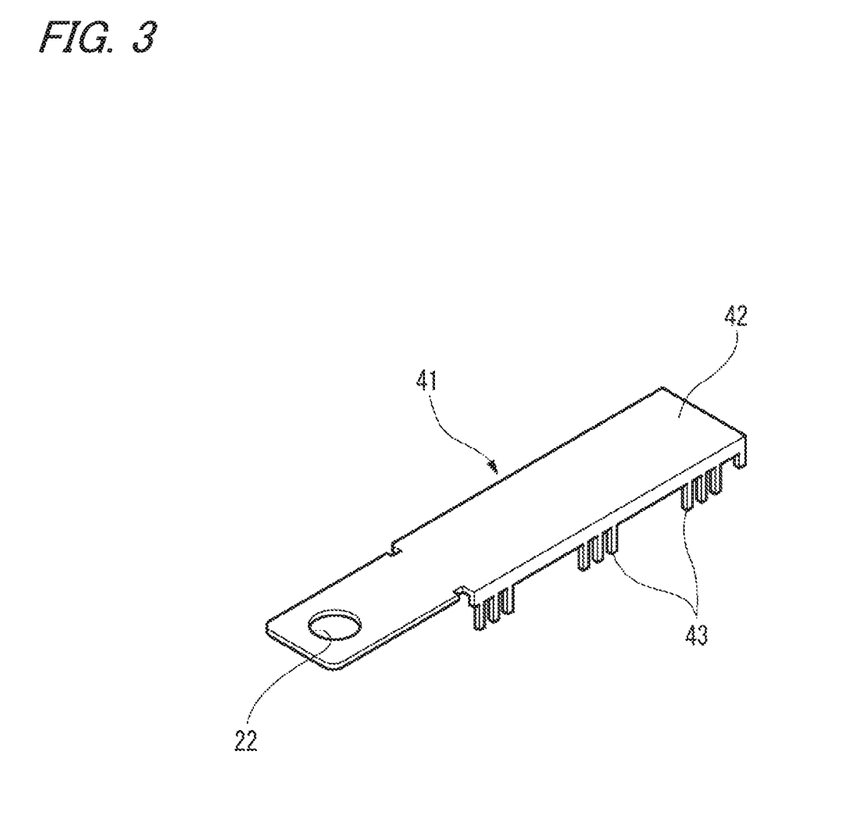
FIG. 3 is a perspective view of a bus bar.
Figure 4A:
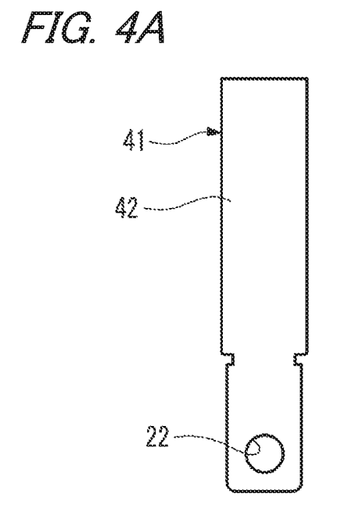
FIG. 4A is a plan view of the bus bar.
Figure 4B:
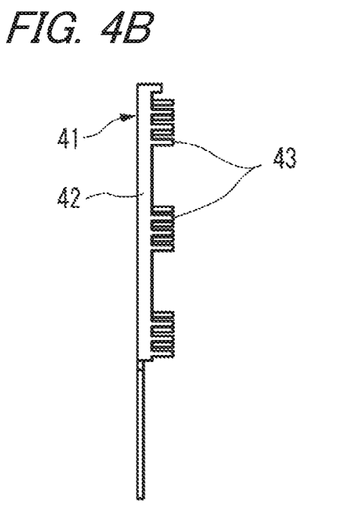
FIG. 4B is a side view of the bus bar.
Figure 4C:
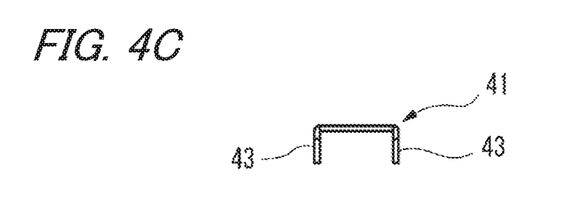
FIG. 4C is a front view of the bus bar.

FIG. 3 is a perspective view of a bus bar. FIG. 4A to FIG. 4C are views showing the bus bar. FIG. 4A is a plan view of the bus bar. FIG. 4B is a side view of the bus bar. FIG. 4C is a front view of the bus bar.

As shown in FIG. 3 and FIG. 4A to FIG. 4C, each bus bar 41 is, for example, formed out of a metal plate of copper, a copper alloy, aluminum, an aluminum alloy, gold, stainless steel (SUS), or the like. The bus bar 41 is formed into a rectangular shape in planar view. One end part of the bus bar 41 serves as the connection terminal portion 21A, 21B, and the other part serves as a mounting portion 42. The mounting portion 42 has a plurality of terminals 43 in each of its opposite side parts. The terminals 43 are bent and extended in one and the same direction.

The terminals 43 of the bus bar 41 are inserted into through holes formed in the first circuit board 40 and soldered with a conductor pattern of the first circuit board 40. Thus, the bus bar 41 is fixed to the first circuit board 40 in the state where the bus bar 41 has been conductively connected to the conductor pattern.

A fixing fitting 51 is attached to the bus bar 41. The fixing fitting 51 has an insertion hole 52. The bus bar 41 is inserted into the insertion hole 52 from its one end side. In addition, screw holes 53 are formed in the opposite end parts of the fixing fitting 51. Screws inserted into hole portions formed in the first circuit board 40 and from the back side of the first circuit board 40 are screwed down to the screw holes 53. Thus, the fixing fitting 51 is fixed to the vicinity of an edge portion of the first circuit board 40. In this manner, one end side of the bus bar 41 serving as the connection terminal portion 21A, 21B is supported on the first circuit board 40 by the fixing fitting 51.

Figure 5:
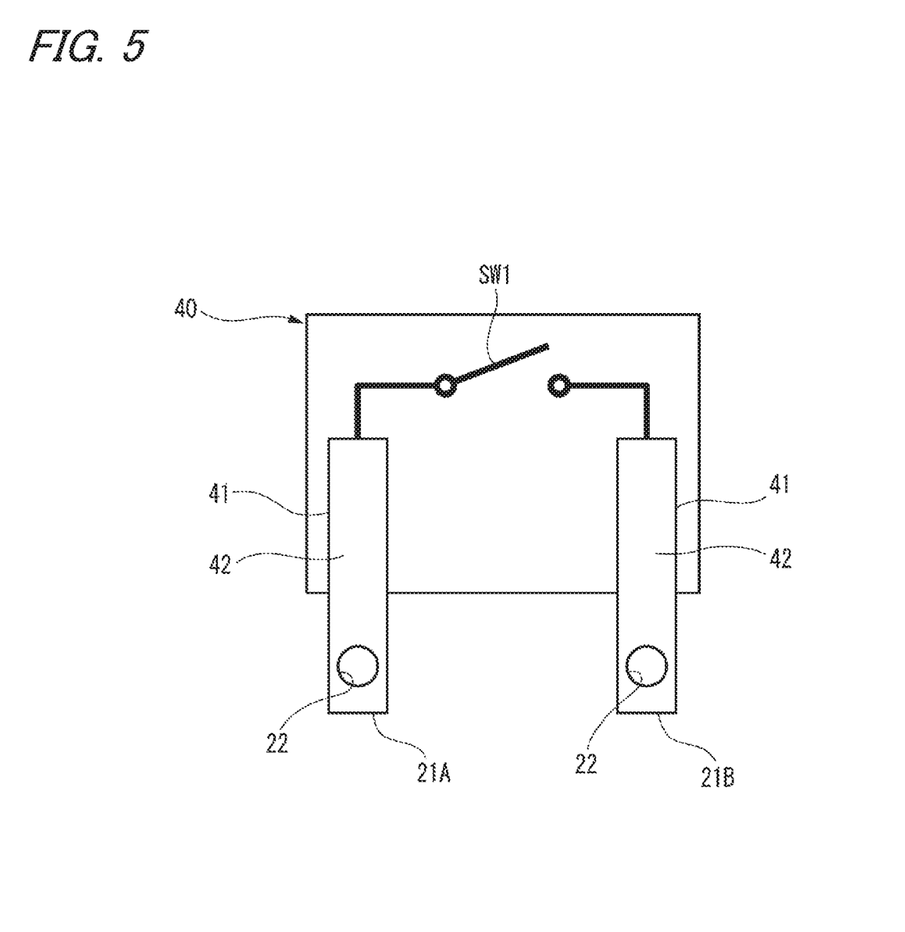
FIG. 5 is a schematic view showing the circuit configuration of the switch box provided with the first circuit board.

FIG. 5 is a schematic view showing the circuit configuration of the switch box provided with the first circuit board.

As shown in FIG. 5, in the switch box 10, a first switch portion SW1 is provided between the bus bar 41 whose one end serves as the connection terminal portion 21A and the bus bar 41 whose one end serves as the connection terminal portion 21B. The first switch portion SW1 is constituted by the electronic components 45 such as MOSFETs, which are semiconductor devices mounted on the first circuit board 40. Thus, a circuit between the connection terminal portions 21A and 21B can be opened and closed by the first switch portion SW1.

The switch box 10 is, for example, mounted for use in a power supply system of a vehicle such as a car. Through a control line connected to the connector 23, a control signal is transmitted to the switch box 10 from a control portion for controlling the power supply system, so that opening and closing the first switch portion SW1 can be controlled by the control signal.

In a power supply system of a vehicle, the number of switches may be changed in accordance with a change in the specification thereof. In accordance with the change in the number of switches, the aforementioned switch box 10 can be changed into a configuration including two switches.

The configuration of the switch box 10 in which the number of switches has been changed to two will be described below.

Figure 6:
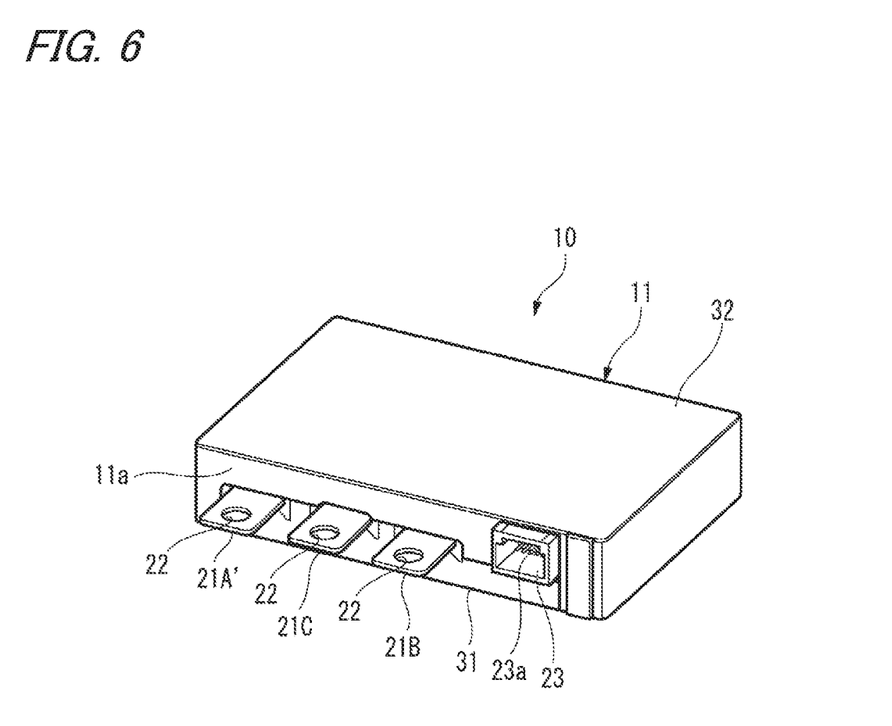
FIG. 6 is a perspective view of the switch box according to the Embodiment.

FIG. 6 is a perspective view of the switch box according to the embodiment.

As shown in FIG. 6, in the switch box 10 in which the number of switches has been changed to two, three connection terminal portions 21A', 21B and 210 are exposed from the front face portion 11a of the housing 11. Mating terminal portions are fastened and connected to the connection terminal portions 21A', 21 B and 210 by bolts. Bolt insertion holes 22 to which the bolts for fastening the mating terminal portions are inserted are formed in the connection terminal portions 21A', 21B and 21C respectively.

Figure 7:
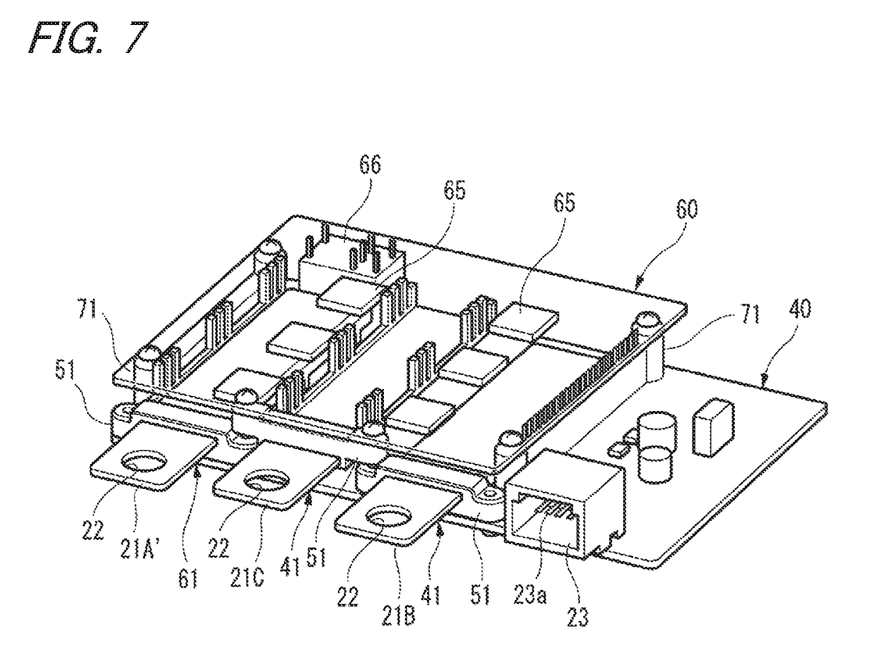
FIG. 7 is a perspective view of the first circuit board and a second circuit board to be combined with each other and received in the housing.

FIG. 7 is a perspective view of the first circuit board and a second circuit board to be combined and received inside the housing.

As shown in FIG. 7, in the switch box 10, a second circuit board 60 is received inside the housing 11 together with the first circuit board 40. The second circuit board 60 is mounted on the first circuit board 40. The second circuit board 60 is removably attached to the first circuit board 40. Incidentally, in FIG. 7, the second circuit board 60 is depicted to be transparent so that the internal structure of the switch box 10 can be grasped easily.

Figure 8:
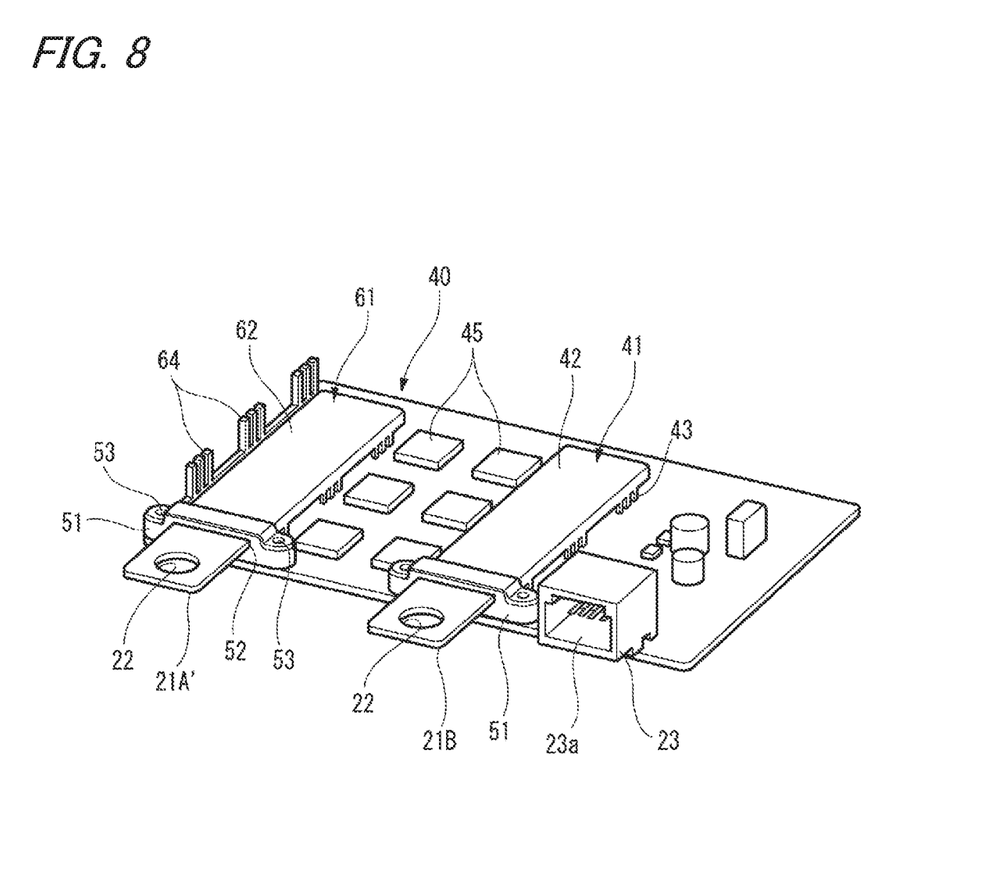
FIG. 8 is a perspective view of the first circuit board from which the second circuit board has been removed.

FIG. 8 is a perspective view of the first circuit board from which the second circuit board has been removed.

As shown in FIG. 8, two bus bars 41 and 61 are mounted on the first circuit board 40. An end part of the bus bar 41 serves as the connection terminal portion 21B having the bolt insertion hole 22. An end part of the bus bar 61 serves as the connection terminal portion 21A' having the bolt insertion hole 22.

As described previously, the bus bar 41 is, for example, formed out of a metal plate of copper, a copper alloy, aluminum, an aluminum alloy, gold, stainless steel (SUS), or the like. The other part than the end part serving as the connection terminal portion 21B serves as the mounting portion 42. A plurality of terminals 43 bent and extended in one and the same direction are provided in each of the opposite side parts of the mounting portion 42.

The terminals 43 in the opposite side parts of the bus bar 41 are inserted into through holes formed in the first circuit board 40 and soldered with a conductor pattern of the first circuit board 40. Thus, the bus bar 41 is fixed to the first circuit board 40 in the state where the bus bar 41 has been conductively connected to the conductor pattern.

In addition, the one end side of the bus bar 41 serving as the connection terminal portion 21B is supported on the first circuit board 40 by the fixing fitting 51.

Figure 9:
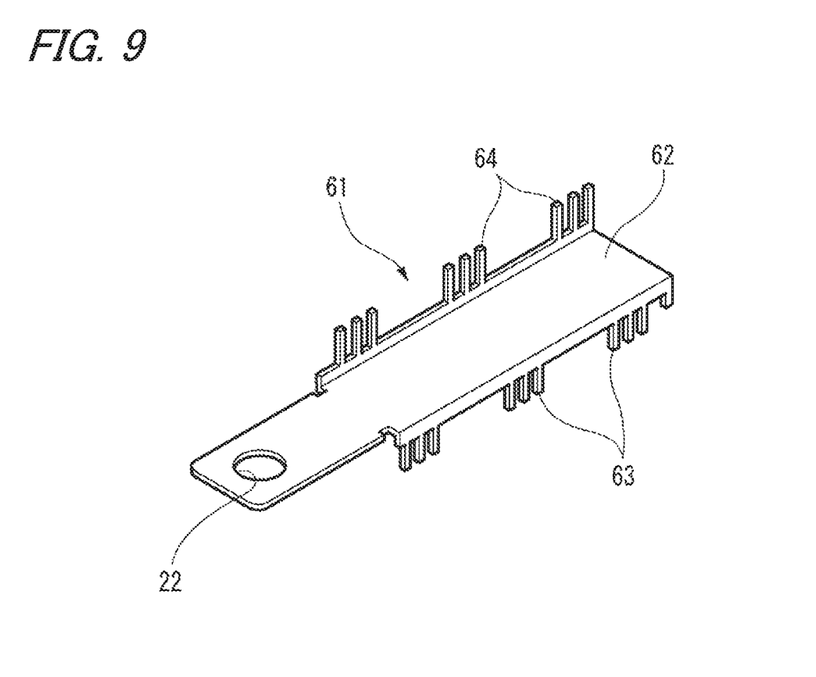
FIG. 9 is a perspective view of a bus bar.
Figure 10A:
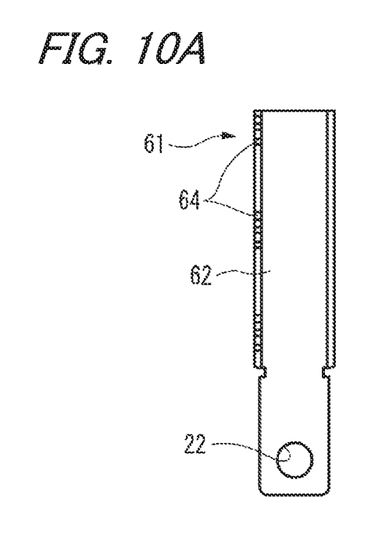
FIG. 10A is a plan view of the bus bar.
Figure 10B:
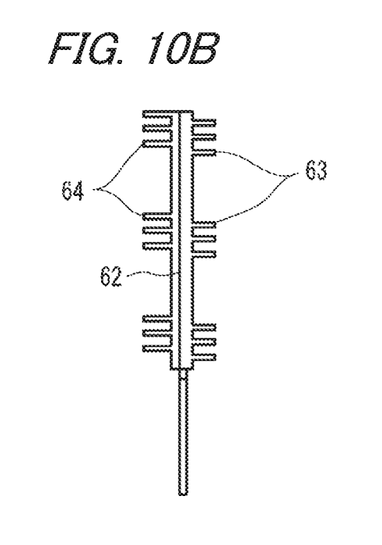
FIG. 10B is a side view of the bus bar.
Figure 10C:
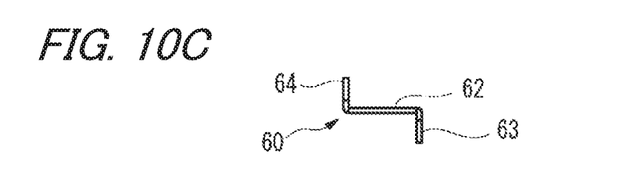
FIG. 10C is a front view of the bus bar.

FIG. 9 is a perspective view of a bus bar. FIG. 10A to FIG. 10C are views showing the bus bar. FIG. 10A is a plan view of the bus bar. FIG. 10B is a side view of the bus bar. FIG. 10C is a front view of the bus bar.

As shown in FIG. 9 and FIGS. 10A to 10C, the bus bar 61 is, for example, formed out of a metal plate of copper, a copper alloy, aluminum, an aluminum alloy, gold, stainless steel (SUS), or the like. The bus bar 61 is formed into a rectangular shape in planar view, In the bus bar 61, the other part than an end part serving as the connection terminal portion 21A' serves as a mounting portion 62. A plurality of terminals 63 bent and extended in one and the same direction are provided in one side part of the mounting portion 62. In addition, in the bus bar 61, a plurality of coupling terminals 64 bent and extended in the opposite direction to the terminals 63 are provided in the other side part of the mounting portion 62.

The terminals 63 in the one side part of the bus bar 61 are inserted into through holes formed in the first circuit board 40 and soldered with a conductor pattern of the first circuit board 40. Thus, the bus bar 61 is fixed to the first circuit board 40 in the state where the bus bar 61 has been conductively connected to the conductor pattern. In addition, a fixing fitting 51 is also attached to the bus bar 61. Thus, the one end side of the bus bar 61 serving as the connection terminal portion 21A' is supported on the first circuit board 40 by the fixing fitting 51.

Figure 11:
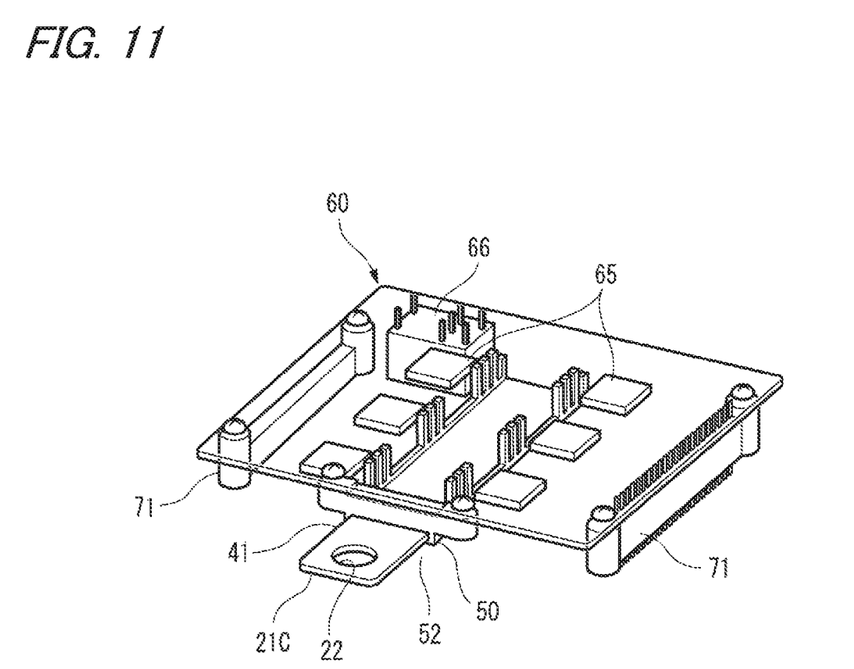
FIG. 11 is a perspective view of the second circuit board which has been removed from the first circuit board.

FIG. 11 is a perspective view of the second circuit board removed from the first circuit board. Incidentally, in FIG. 11, the second circuit board 60 is depicted to be transparent so that the structure can be grasped easily.

As shown in FIG. 11, the aforementioned bus bar 41 is mounted on the second circuit board 60. The second circuit board 60 is disposed to be overlaid on the first circuit board 40. A pedestal 71 is fixed to the second circuit board 60 so that the second circuit board 60 can be disposed at a predetermined gap from the first circuit board 40 by the pedestal 71.

The bus bar 41 is mounted on the surface side where the second circuit board 60 is opposed to the first circuit board 40. The terminals 43 of the bus bar 41 are inserted into through holes formed in the second circuit board 60 and soldered with a conductor pattern of the second circuit board 60. Thus, the bus bar 41 is fixed to the second circuit board 60 in the state where the bus bar 41 has been conductively connected to the conductor pattern.

The second circuit board 60 is overlaid on the first circuit board 40. Consequently the coupling terminals 64 on the other side part side of the bus bar 61 are inserted into through holes of the second circuit board 60. The coupling terminals 64 inserted into the through holes are soldered with the conductor pattern of the second circuit board 60. Thus, the conductor pattern and the bus bar 61 are conductively connected to each other.

When the second circuit board 60 is mounted to be overlaid on the first circuit board 40, the bus bar 41 of the second circuit board 60 is disposed in an intermediate position between the bus bars 41 and 61 of the first circuit board 40.

Figure 12:
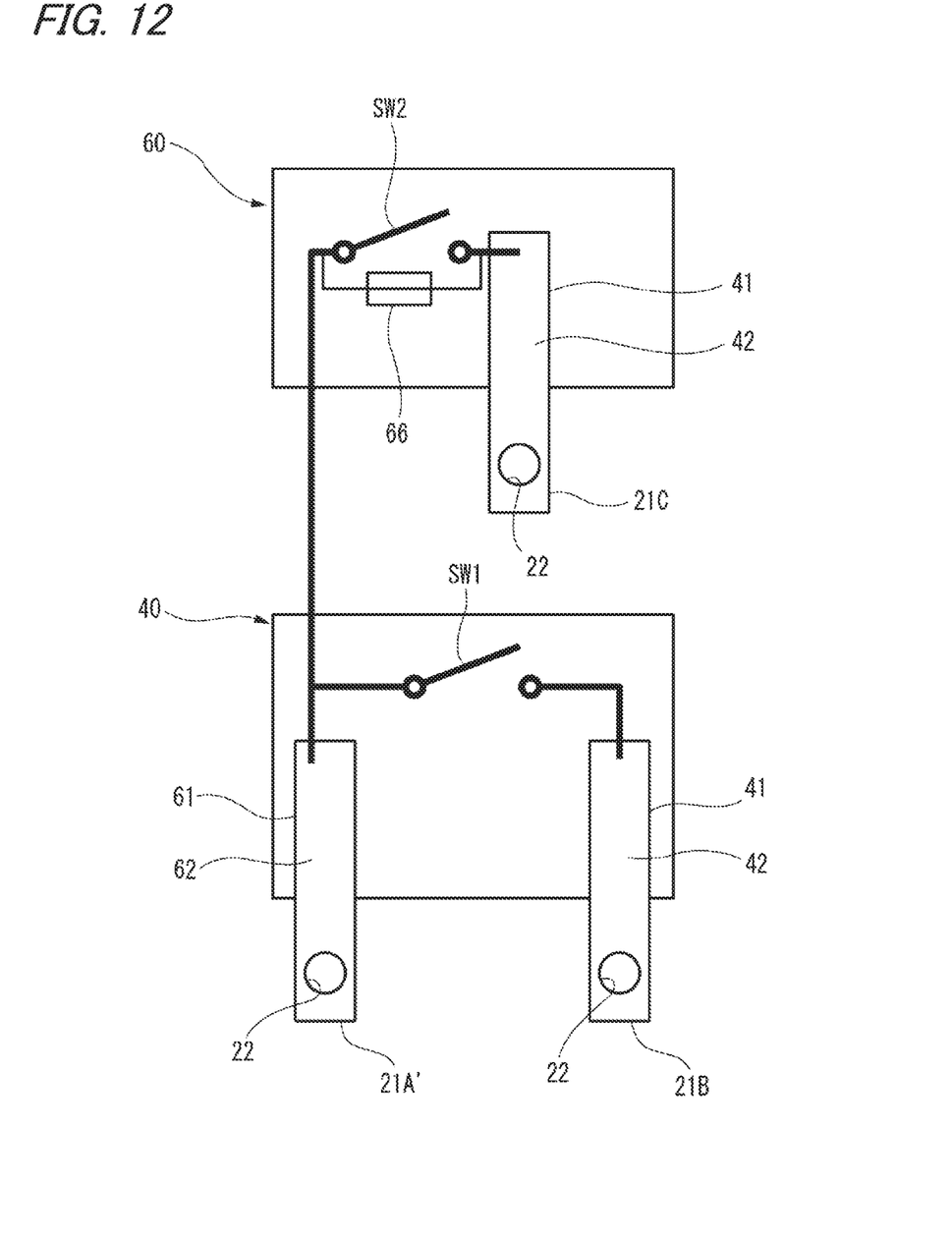
FIG. 12 is a schematic view showing the circuit configuration of the switch box provided with the first circuit board and the second circuit board.

In addition, electronic components 65 such as semiconductor devices for switching, and a latch relay 66 are mounted on the second circuit board 60, FIG. 12 is a schematic view showing the circuit configuration of the switch box provided with the first circuit board and the second circuit board.

As shown in FIG. 12, in the switch box 10, a first switch portion SW1 is provided between the bus bar 61 and the bus bar 41 constituted by the electronic components 45 such as MOSFETs, which are semiconductor devices mounted on the first circuit board 40. One end of the bus bar 61 serves as the connection terminal portion 21A', and one end of the bus bar 41 serves as the connection terminal portion 21B. In this manner, a circuit between the connection terminal portions 21A and 21B can be opened and closed by the first switch portion SW1. In addition, a second switch portion SW2 is provided between the bus bar 61 and the bus bar 41 constituted by electronic components 65 such as MOSFETs, which are semiconductor devices mounted on the second circuit board 60. One end of the bus bar 61 serves as the connection terminal portion 21A', and one end of the bus bar 41 serves as the connection terminal portion 21C. In this manner, a circuit between the connection terminal portions 21A' and 21C can be opened and closed by the second switch portion SW2. In addition, the latch relay 66 mounted on the second circuit board 60 is provided in parallel with the second switch portion SW2.

Next, description will be made about a case where the aforementioned switch box 10 is used in a power supply system of a vehicle.

Figure 13A:
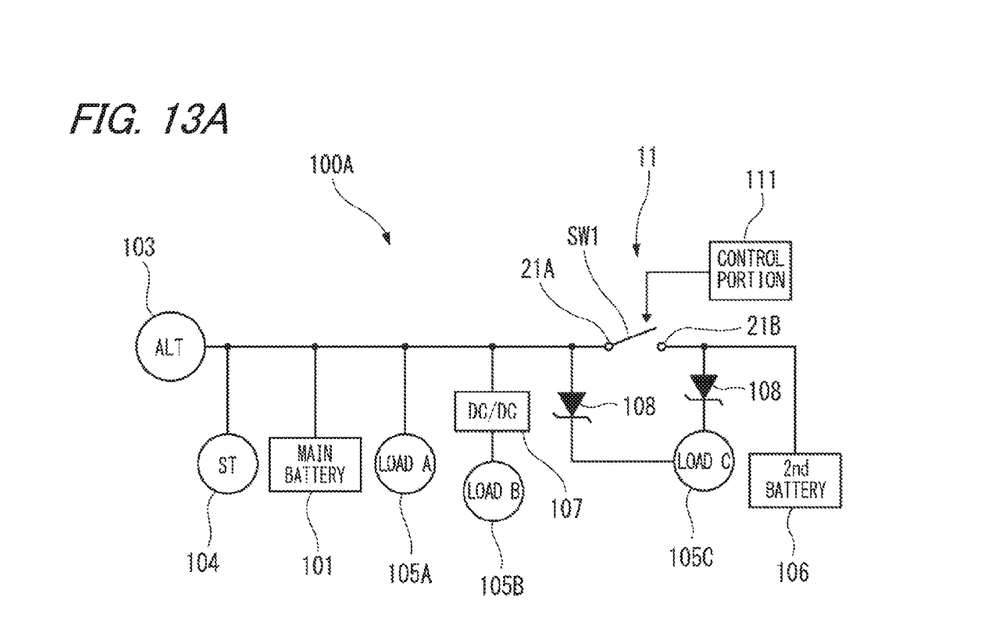
Figure 13B:
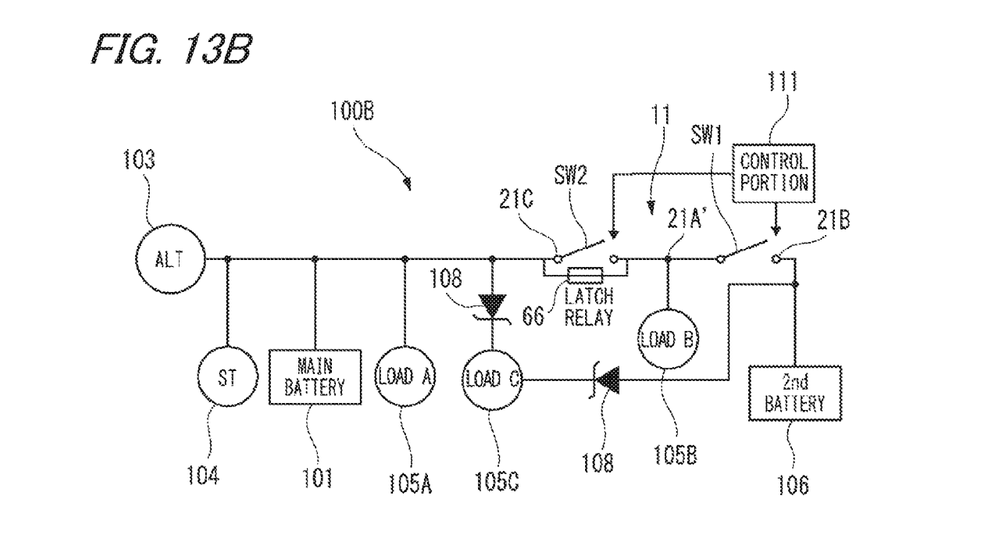

FIG. 13A and FIG. 13B are views showing the power supply system using the switch box according to the embodiment. FIG. 13A and FIG. 13B are schematic configuration views respectively.

Example of Use of Switch Box 10 in which the Number of Switches is One

As shown in FIG. 13A, this power supply system 100A has a main battery 101, an alternator 103, a starter 104, and loads 105A, 105B and 105C. The alternator 103, the starter 104 and the loads 105A, 105B and 105C are connected to the main battery 101. In addition, the power supply system 100A has a second battery 106.

The alternator 103 is rotated by an engine of the vehicle to thereby generate electric power. The electric power generated and obtained by the alternator 103 is accumulated in the main battery 101 and the second battery 106. The starter 104 is rotated by the electric power of the main battery 01, and the engine is started by the torque of the starter 104.

The load 105A is, for example, an audio apparatus, a navigation apparatus, or the like. The load 105B is, for example, a meter or an indoor lighting system. The load 105B is a load requiring voltage boosting. The load 105B is connected to the main battery 101 through a DC/DC converter 107. For example, in a vehicle having an idling stop function for stopping the engine during stop of the vehicle, the voltage of the main battery 101 may drop when the engine is started again by the starter 104. In spite of such a voltage drop, a failure in operation of the load 105B can be prevented due to the voltage boosting by the DC/DC converter 107. The load 105C is, for example, a door lock or an emergency call (e-call). The load 105C is a backup object load which has to be backed up. The load 105C is connected to the main battery 101 and the second battery 106 through diodes 108 respectively. The second battery 106 is a spare battery for the load 105C which is a backup object load.

In the power supply system 100A, the switch box 10 according to the embodiment is provided between the main battery 101 and the second battery 106. The switch box 10 has one switch portion, that is, the first switch portion SW1. The main battery 101 is connected to the connection terminal portion 21A, and the second battery 106 is connected to the connection terminal portion 21B. The first switch portion SW1 of the switch box 10 is controlled to be opened and closed by a control portion 111.

In the power supply system 100A, when the first switch portion SW1 of the switch box 10 is turned ON by the control portion 111, an electric current can flow in both directions between the main battery 101 and the second battery 106. In addition, in the power supply system 100A, the first switch SW1 of the switch box 10 is turned OFF by the control portion 111 during a failure in the main battery 101 or during parking of the vehicle. In this state, the load 105C can be driven by electric power from the second battery 106.

Example of Use of Switch Box 10 in which the Number of Switches is Two

As shown in FIG. 13B, this power supply system 100B has substantially the same configuration as the power supply system 100A, except that the DC/DC converter 107 is not provided. In the power supply system 100B, the switch box 10 according to the embodiment is provided between the main battery 101 and the second battery 106. The switch box 10 has two switch portions, that is, the first switch portion SW1 and the second switch portion SW2. The main battery 101 is connected to the connection terminal portion 21C, and the second battery 106 is connected to the connection terminal portion 21B. In addition, the load 105B is connected to the connection terminal portion 21A' of the switch box 10. The first switch portion SW1 and the second switch portion SW2 of the switch box 10 are controlled to be opened and closed by a control portion 111.

In the power supply system 100B, when the first switch portion SW1 and the second switch portion SW2 are turned ON by the control portion 111, an electric current can flow in both directions between the main battery 101 and the second battery 106.

In the power supply system 100B, when the engine is started by the starter 104 during idling stop of the vehicle, the control portion 111 turns ON the first switch portion SW1, and turns OFF the second switch portion SW2. Thus, electric power is supplied from the second battery 106 to the load 105B when the engine is started by the starter 104. Accordingly, a failure in operation of the load 105B caused by a voltage drop in the main battery 101 when the engine is started again can be prevented in spite of the absence of the DC/DC converter 107.

In addition, when a failure occurs in the main battery 101, the first switch portion SW1 is turned OFF to make disconnection between the main battery 101 and the load 105B. Even in this state, electric power can be surely supplied from the second battery 106 to the load 105C which is a backup object load. Incidentally, during parking of the vehicle, the second switch portion SW2 is turned OFF so that an electric current can flow into the load 105B by the latch relay 66.

In addition, in the power supply system 100B, the first switch portion SW1 and the second switch portion SW2 are turned ON/OFF suitably so that regenerative energy can be delivered to the second battery 106 to thereby charge the second battery 106. Thus, it is possible to improve the fuel efficiency of the vehicle.

As has been described above, when one switch function is required in a circuit, only the first circuit board 40 having the first switch portion SW1 is provided in the switch box 10 according to the aforementioned embodiment. The circuit is connected to the connection terminal portions 21A and 21B of the bus bar 41. Thus, the circuit can be opened and closed by the first switch portion SW1. On the other hand, when two switch functions are required in circuits, the second circuit board 60 having the second switch portion SW2 is mounted on the first circuit board 40. The circuits are connected to the connection terminal portions 21A', 21B and 21C of the bus bars 41 and 61. Thus, one of the circuits can be opened and closed by the first switch portion SW1, and the other circuit can be opened and closed by the second switch portion SW2.

For example, even if the number of switches in a power supply system is changed in accordance with a change in the configuration of the system, it is not necessary to design and manufacture a switch box corresponding to the number of switches, but it is possible to provide a switch box capable of supporting each power supply system. Thus, components, housings, etc. can be shared. It is possible to economically suppress increase in man-hours of development and increase in manufacturing cost due to a change in the number of switches.

In the power supply system for a vehicle including the main battery 101 and the second battery 106 as a sub-battery, switches are provided for switching power supply from the main battery 101 and the second battery 106 to various loads and so on. The number of switches may be changed in accordance with a change in specification or the like. Even in such a case, the number of switches can be changed easily to support the change in the system when the second circuit board 60 is attached to or removed from the first circuit board 40.

In addition, when the coupling terminals 64 of one of the bus bars, that is, the bus bar 61 of the first circuit board 40 are connected to the second circuit board 60, the switch box 10 can be extremely easily arranged to have the first switch portion SW1 of the first circuit board 40 and the second switch portion SW2 of the second circuit board 60.

In addition, the bus bar 41 of the second circuit board 60 is disposed in an intermediate position between the pair of bus bars 41 and 61 of the first circuit board 40 when the second circuit board 60 has been mounted on the first circuit board 40. It is therefore possible to secure good heat radiation in each bus bar 41, 61. Thus, even when the bus bars 41 and 61 generate heat due to an electric current flowing therein, heat interference affecting electronic components etc. can be suppressed as well as possible.

Incidentally, the invention is not limited to the aforementioned embodiment, but deformations, improvements, etc. can be made suitably. In addition, materials, shapes, dimensions, numbers, arrangement places, etc. of respective constituent elements in the aforementioned embodiment are not limited. Any materials, any shapes, any dimensions, any numbers, any arrangement places, etc, may be used as long as the invention can be attained.

Here, the features of the aforementioned embodiment of the switch box according to the invention will be summarized and listed briefly in the following paragraphs [1] to [4].

[1] A switch box (10) including:
a first circuit board (40):
a pair of bus bars (41 and 61) that are provided in the first circuit board (40); and
a first switch portion (SW1) that is provided in the first circuit board (40) so as to open and close a circuit between the pair of bus bars (41 and 61); wherein:
a second circuit board (60) can be removably attached to the first circuit board (40), the second circuit board (60) including:
a bus bar (41); and
a second switch portion (SW2) that opens and closes a circuit between the bus bar (41) of the second circuit board (60) and one (61) of the bus bars of the first circuit board (40).

[2] A switch box (10) according to the aforementioned paragraph [1], wherein:
the one (61) of the bus bars of the first circuit board (40) has coupling terminals (64) that can be connected to the second circuit board (60).

[3] A switch box (10) according to the aforementioned paragraph [1], wherein:
the bus bar (41) of the second circuit board (60) is disposed in an intermediate position between the pair of bus bars (41 and 61) of the first circuit board (40) when the second circuit board (60) is mounted on the first circuit board (40).

[4] A switch box (10) according to the aforementioned paragraph [1], wherein:
the switch box (10) is provided between a main battery (101) and a sub-battery (second battery 106) in a power supply system for a vehicle, the power supply system including the main battery (101) and the sub-battery (106) that supply electric power to various loads.

Although the invention has been described in detail and with reference to its specific embodiment, it is obvious for those skilled in the art that various changes or modifications can be made without departing from the spirit and scope of the invention.

The invention provides an effect that it is possible to provide an economical switch box capable of suppressing increase in man-hours of development and increase in manufacturing cost caused by a change in number of switches. The invention providing the effect is useful for a switch box to be provided in a power supply system of a vehicle.

What is claimed is:

1. A switch box comprising:
a first circuit board;
a pair of bus bars that are provided in the first circuit board; and
a first switch portion that is provided in the first circuit board so as to open and close a circuit between the pair of bus bars; wherein:
a second circuit board can be removably attached to the first circuit board, the second circuit board including:
a bus bar; and
a second switch portion that opens and closes a circuit between the bus bar of the second circuit board and one of the bus bars of the first circuit board.

2. A switch box according to claim 1, wherein:
the one of the bus bars of the first circuit board has coupling terminals that can be connected to the second circuit board.

3. A switch box according to claim 1, wherein:
the bus bar of the second circuit board is disposed in an intermediate position between the pair of bus bars of the first circuit board when the second circuit board is mounted on the first circuit board.

4. A switch box according to claim 1, wherein:
the switch box is provided between a main battery and a sub-battery in a power supply system for a vehicle, the power supply system including the main battery and the sub-battery that supply electric power to various loads.

* * * * *